United States Patent
Lee

(10) Patent No.: US 6,534,361 B2
(45) Date of Patent: Mar. 18, 2003

(54) METHOD OF MANUFACTURING A SEMICONDUCTOR DEVICE INCLUDING METAL CONTACT AND CAPACITOR

(75) Inventor: Joo-Won Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/923,437

(22) Filed: Aug. 8, 2001

(65) Prior Publication Data

US 2002/0048880 A1 Apr. 25, 2002

(30) Foreign Application Priority Data

Aug. 9, 2000 (KR) .............................. 00-46090

(51) Int. Cl.⁷ .......................................... H01L 21/8242
(52) U.S. Cl. ....................................... 438/253; 438/241
(58) Field of Search ................................ 438/253, 254, 438/255, 244, 241, 256

(56) References Cited

U.S. PATENT DOCUMENTS

| 6,077,742 A | * | 6/2000 | Chen et al. ................. 438/255 |
| 6,168,984 B1 | * | 1/2001 | Yoo et al. .................... 438/239 |
| 6,251,726 B1 | * | 6/2001 | Huang ......................... 438/253 |
| 6,313,497 B1 | * | 11/2001 | Iwasa ......................... 257/306 |
| 6,350,642 B1 | * | 2/2002 | Lee et al. .................... 438/238 |

* cited by examiner

Primary Examiner—Michael Trinh
(74) Attorney, Agent, or Firm—Volentine Francos, PLLC

(57) ABSTRACT

A method for manufacturing a semiconductor device including a metal contact and a capacitor. Gate structures are formed on a semiconductor substrate, and a first dielectric layer is formed on the semiconductor substrate to cover the gate structures. A bit line is formed on the first dielectric layer and a second dielectric layer is formed on the first dielectric layer to cover the bit line. A buried contact is formed to be electrically connected to the semiconductor substrate between the gate structures by etching the second dielectric and first dielectric layer. A third dielectric layer is formed on the second dielectric layer. A lower electrode of a capacitor, a dielectric layer, and an upper electrode are formed to be connected to the buried contact. A fourth dielectric layer is formed to cover the capacitor. A plurality of contact holes are formed to expose the upper electrode, the bit line, an active region of the semiconductor substrate, and the gate structures by selectively etching the fourth dielectric layer and the underlying dielectric layers. A plurality of metal contacts are formed to be electrically connected to the upper electrode, the semiconductor substrate, the bit line, and the gate structures by filling the contact holes.

21 Claims, 10 Drawing Sheets

METHOD OF MANUFACTURING A SEMICONDUCTOR DEVICE INCLUDING METAL CONTACT AND CAPACITOR

BACKGROUND OF THE INVENTION

1. Field of the Invention

The present invention relates to a method of manufacturing a semiconductor device, and more particularly, to a method of manufacturing a capacitor and a metal contact for a semiconductor device.

2. Description of the Related Art

As the integration density of a semiconductor device increases, the pitch size and margins for an etching process decrease. Thus, for example, in a case where a deep and small metal contact (DSMC) process is performed to selectively pattern a dielectric layer having a step difference of 20,000 Å or greater to form a metal contact, numerous problems may occur during the photolithography and etching processes. The DSMC process is mainly applied to a capacitor with a bit line structure or a multi-layered interconnection structure, and thus it is important to effectively solve those processing problems.

In most cases, the above described metal contact is formed using two metal contact step sequences. Specifically, in a first sequence of steps, a first dielectric layer is formed on a bit line. When the step difference or thickness of the first dielectric layer reaches about 10,000 Å, a process for forming a first metal contact is carried out. The process for forming the first metal contact comprises the steps of forming a first contact hole through the first dielectric layer and thereafter depositing a first metal layer in the first contact hole, thereby forming a metal plug or a metal stud. The metal may be comprised of tungsten, or other metal with similar properties.

Next, in a second sequence of steps, a process for forming a second metal contact comprises the steps of forming a second dielectric layer on the first dielectric layer and the metal plug or the metal stud, forming a second contact hole through the second dielectric layer to expose the metal plug or the metal stud, and then depositing a second metal layer in the second contact hole and on the second dielectric layer, thereby forming a metal interconnection layer connected to the metal plug or the metal stud. A process for forming a capacitor is additionally performed between the two processes of forming first and second metal contacts.

However, these processes for forming a metal contact and a capacitor are very complicated and may cause productivity to decrease, especially if not properly performed. In addition, since the process for forming a first metal contact is performed before the process for manufacturing a capacitor, metal contact resistance may increase due to the influence of the subsequent processes. In other words, the contact resistance of the metal plug or the metal stud, formed by the process for forming a first metal contact, may increase due to heat budgets that accompany a subsequent process for forming a silicon nitride layer or a heat treatment process for forming a capacitor.

FIG. 11 illustrates the increase in contact resistance due to the heat budget. As shown in FIG. 11, as the heat budgets that accompany the subsequent processes increase, the contact resistance of a metal contact, such as the metal stud or metal plug, increases. In particular, when a heat budget of a temperature of 750° C. or greater is present, the contact resistance goes up dramatically. The increase in the contact resistance of a metal contact may have a negative influence and thereby degrade the high-speed operations of a semiconductor device.

SUMMARY OF THE INVENTION

To solve the above problems, it is an object of the present invention to provide a method of manufacturing a semiconductor device including a metal contact and a capacitor, which is capable of preventing the increase in the contact resistance of a metal contact due to heat budget, and in addition, simplifies the whole manufacturing process by overcoming a high step difference between dielectric layers.

Accordingly, to achieve the above object, there is provided a method of manufacturing a semiconductor device. First, gate structures are formed on a semiconductor substrate, and a first dielectric layer is formed on the semiconductor substrate to cover the gate structures. A bit line is then formed on the first dielectric layer and a second dielectric layer is formed on the first dielectric layer to cover the bit line. A buried contact is formed to be electrically connected to the semiconductor substrate between the gate structures by etching the second dielectric and first dielectric layer. A third dielectric layer is then formed on the second dielectric layer. A lower electrode of a capacitor, a dielectric layer, and an upper electrode are formed to be connected to the buried contact. A fourth dielectric layer is formed to cover the capacitor. A plurality of contact holes are formed to expose the upper electrode, the bit line, an active region of the semiconductor substrate, and the gate structures by selectively etching the fourth dielectric layer and the underlying dielectric layers. A plurality of metal contacts are formed to be electrically connected to the upper electrode, the semiconductor substrate, the bit line, and the gate structures by filling the contact holes.

The plurality of contact holes may be formed after the first through fourth dielectric layers have been deposited, or preferably, in two steps, by first forming lower contact hole regions before forming the third dielectric layer, and then forming upper contact hole regions that are aligned with and communicate with the lower contact hole regions.

The lower contact hole regions are formed by selectively etching the second dielectric layer and first dielectric layer to expose the bit line, the conductive pattern of one of the gate structures, and the semiconductor substrate. Then, the third dielectric layer is formed of a material having discrete step coverage characteristics which cause voids to form within the plurality of lower contact hole regions while depositing the third dielectric layer over the second dielectric layer.

In other words, the third dielectric layer has inferior step coverage (i.e., poor fluidity), when it is deposited over the second dielectric layer, which thereby seals the opening each of the plurality of lower contact hole regions and precludes additional material of the third dielectric layer from forming in the lower contact hole regions.

In addition, an etching stopper may be further formed between the third dielectric layer and the second dielectric layer.

An ohmic layer may be further formed under the plurality of metal contacts to be in ohmic-contact with the plurality of metal contacts, and may be formed to cover the sides and the bottoms of the plurality of lower contact holes after the plurality of lower contact holes are formed. Alternatively, the ohmic layer may be formed on the upper and lower hole regions after the upper hole regions are formed.

According to the present invention, it is possible to omit the step of forming a metal plug or a metal stud, thereby simplifying the whole manufacturing process. In addition, it is possible to prevent damage to the active region of a semiconductor substrate or an upper electrode caused by over-etching in the case of simultaneously forming a variety of metal contact holes.

BRIEF DESCRIPTION OF THE DRAWINGS

The above object and other advantages of the present invention will become more apparent by describing in detail preferred embodiments thereof with reference to the attached drawings in which.

DETAILED DESCRIPTION OF THE INVENTION

Figure 1:
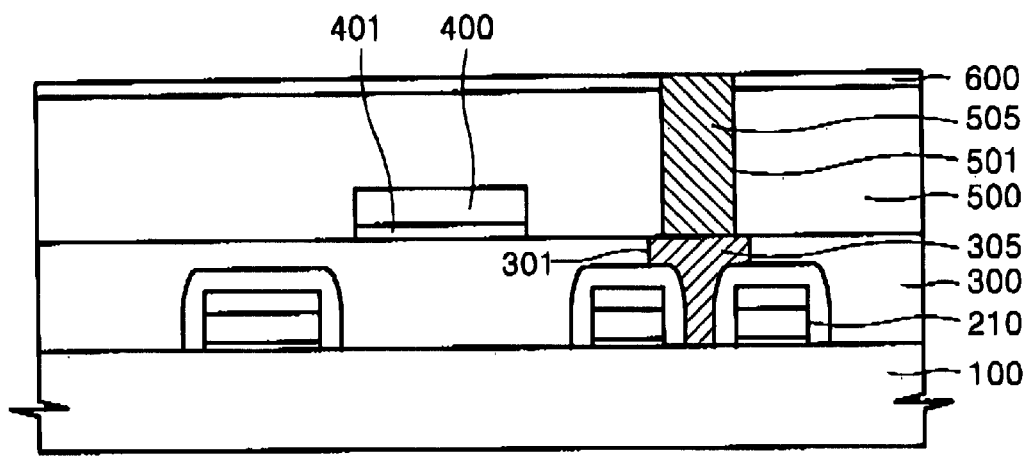
FIGS. 1 through 7 are cross-sectional views illustrating a method for manufacturing a semiconductor device according to a first embodiment of the present invention.

The present invention now will be described more fully with reference to the accompanying drawings, in which preferred embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

In the embodiments of the present invention, a method for simultaneously forming a plurality of contact holes in preparation for metal contacts, which ultimately connect to an active region of a semiconductor substrate, a bit line, a gate, and an upper electrode of a capacitor, are provided. The contact holes can be formed by forming a dielectric layer covering the upper electrode and then selectively etching the dielectric layer and other dielectric layers already formed below the dielectric layer.

FIG. 1 is a cross-sectional view illustrating a step of forming buried contacts 305 and 505 on a semiconductor substrate 100. As shown in FIG. 1, a plurality of gate structures 210 are formed on the semiconductor substrate 100. The gate structures 210 consist of a multi-layered conductive pattern and a dielectric layer for covering and protecting the conductive pattern. A first dielectric layer 300 is formed to cover the gate structures 210.

In an exemplary gate structure formation process, a conductive polysilicon layer is formed on the semiconductor substrate 100, and then a metal silicide layer, such as a tungsten silicide layer, is formed on the conductive polysilicon layer. Next, the layers are patterned, thereby forming a gate of a transistor. A capping dielectric layer may be further formed on the metal silicide layer, and in such cases, the capping dielectric layer is patterned along with the gate structure 210. A spacer layer is then formed along the side wall of the gate structure 210. The first dielectric layer 300 is then formed to cover the gate structures 210. The first dielectric layer 300 may be formed of a suitable dielectric material commonly used in semiconductor processes, such as silicon oxide.

Next, a first buried contact hole 301 is formed through the first dielectric layer 300 on the semiconductor substrate 100 by photolithography and etching processes, thereby exposing the semiconductor substrate 100 between adjacent gate structures 210. The first buried contact hole 301 can be formed by selectively etching the first dielectric layer 300 using a welt-known self-aligned contact (SAC) process. Then, a conductive material is deposited in the first contact hole 301, thereby forming a first buried contact 305 filling the first buried contact hole 301.

Next, a bit line 400, which is formed of a conductive material and includes a barrier layer 401, is formed on the first dielectric layer 300. A second dielectric layer 500 is formed to cover the bit line 400 on the first dielectric layer 300. The second dielectric layer 500 may be formed of a suitable dielectric material, such as silicon oxide.

A second buried contact hole 501 exposing the first buried contact 305 is formed in the second dielectric layer 500 by photolithography and etching processes, and then, a second buried contact 505 is formed to fill the second buried contact hole 501.

As a result, a buried contact structure consisting of the first and second buried contacts 305 and 505 is completed. The first and second buried contacts 305 and 505 may be formed of tungsten or conductive polysilicon. The first and second dielectric layers 300 and 500 may be formed of silicon oxide to have a step difference, that is, a thickness of 10,000 Å.

Alternatively, the first and second buried contacts 305 and 505 may be formed at the same time, after the bit line is formed, by selectively etching the second dielectric layer 500 and first dielectric layer 300.

After the second dielectric layer 500 is formed, an etching stopper 600 may be formed on the second dielectric layer 500. The etching stopper 600 is introduced into the process to ensure a subsequent etching process, described below, is completed upon reaching the surface of the etching stopper 600. The etching stopper 600 is formed of a dielectric material, such as silicon nitride, having a different etching rate than a dielectric material that is later deposited on the etching stopper.

Figure 2:
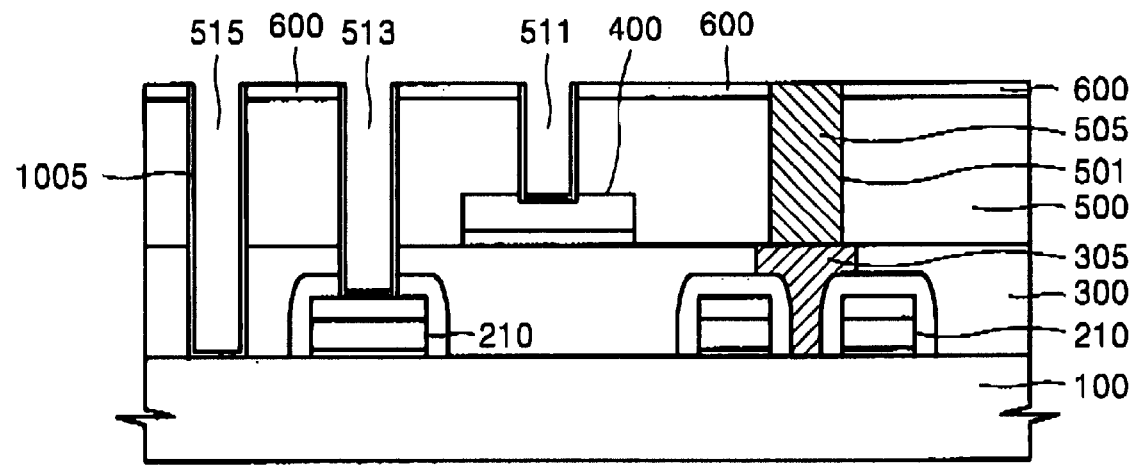

FIG. 2 is a cross-sectional view illustrating the steps of forming first, second, and third lower contact hole regions 511, 513, and 515, respectively, by sequentially etching the second dielectric layer 500 and the first dielectric layer 300 using photolithography and etching techniques. The etching stopper 600 may also be patterned by the photolithography process used for etching the first and second dielectric layers 300 and 500.

As a result of the photolithography and etching techniques, the first lower contact hole region 511 partially exposes the bit line 400 under the second dielectric layer 500. The second lower contact hole region 513 exposes the top surface of the conductive pattern of one of the gate structures 210. The third lower contact hole region 515 exposes an active region on the semiconductor substrate 100. These first, second, and third lower contact hole regions 511, 513, and 515 will ultimately contain metal contacts which will be formed later.

An ohmic layer 1005 may be formed to cover at least the bottom surfaces of the first, second, and third lower contact hole regions 511, 513, and 515 to enable ohmic contacts for the bit line 400 exposed by the first lower contact hole region 511, the conductive pattern of one of the gate structures 210 exposed by the second lower contact hole region 513, and the active region of the semiconductor substrate 100 exposed by the third lower contact hole region 515.

Figure 3:
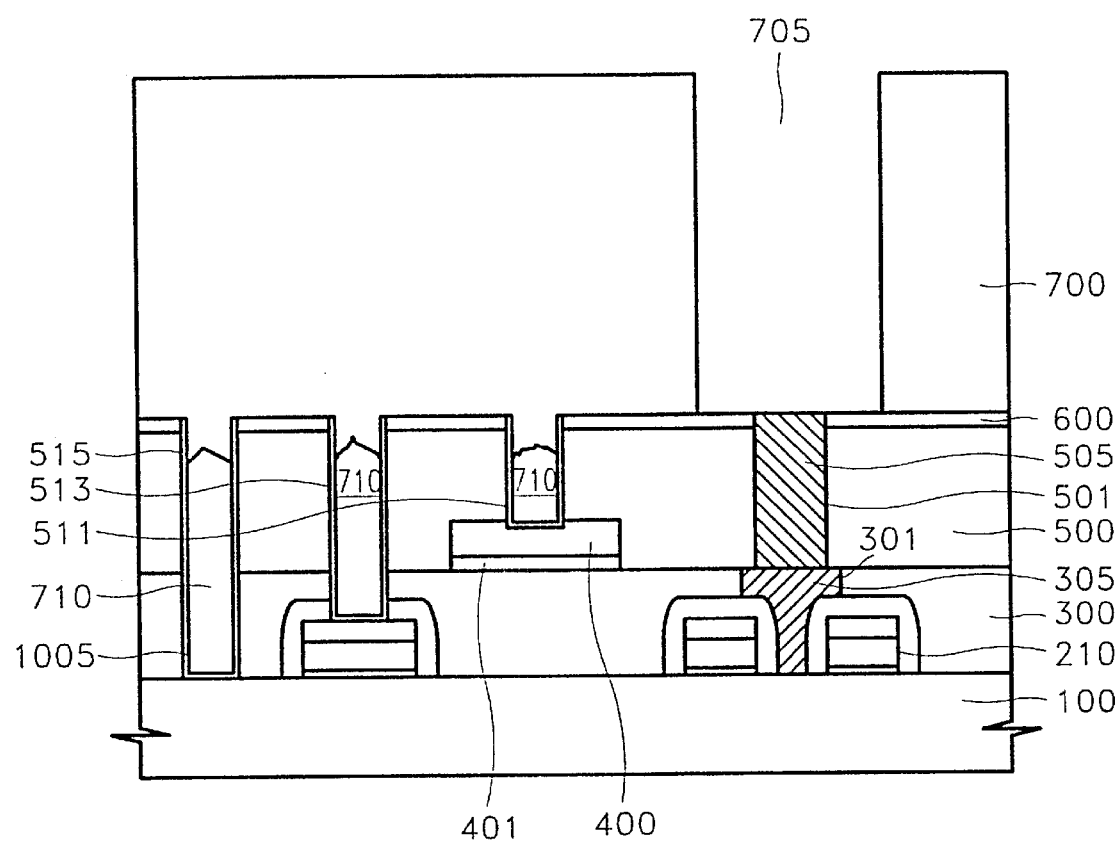

FIG. 3 is a cross-sectional view illustrating the step of forming a third dielectric layer 700 on the second dielectric layer 500 to cover the etching stopper 600. Here, the third dielectric layer 700 is preferably formed by depositing a dielectric material layer having inferior step coverage characteristics (i.e., less fluidity) on the second dielectric layer 500. By using a dielectric material with inferior step coverage characteristics or poor fluidity, even though the third dielectric layer 700 is deposited on the second dielectric layer 500, the first, second, and third contact hole regions 511, 513, and 515 would not be completely filled, and voids 710 are thus generated in the first, second, and third lower contact hole regions 511, 513, and 515, which is the preferable outcome of this process step.

In the embodiments of the present invention, it is preferable that the size of the void is as large as possible. In other words, it is preferable that the first, second, and third lower contact hole regions 511, 513, and 515 are not filled with any of the third dielectric layer 700 material. Most preferably, the third dielectric layer 700 is deposited such that it only blocks the entrances or openings of each of the first, second, and third lower contact hole regions 511, 513, and 515, and thus the sides and bottoms of each of the first, second, and third contact hole regions are not filled with the third dielectric layer 700 material.

An example of a dielectric material having inferior step coverage characteristics is an oxide layer made by chemical vapor deposition (CVD), such as plasma enhanced CVD. The third dielectric layer may be formed of another interlayer dielectric material having superior fluidity, but only if a dielectric material having inferior step coverage is first used to block the entrances or openings of the first, second, and third lower contact hole regions 511, 513, and 515. Regardless of the technique used, the objective is to causes the voids 710 to be generated in the first, second, and third lower contact hole regions 511, 513, and 515.

As described above, after the third dielectric layer 700 is formed, an opening 705 is formed by photolithography processes to expose the buried contact 505, which buried contact 505 in turn contact the buried contact 305. The opening 705 is formed to enable the use of the third dielectric layer 700 as a mold for a concave-shaped lower electrode of a capacitor.

Since the third dielectric layer 700 is used for molding a lower electrode of a capacitor into a concave shape, its resulting thickness will depend on the height of the capacitor. In other words, the height of the third dielectric layer 700 is nearly equal to that of the lower electrode. In the first embodiment of the present invention, the third dielectric layer 700 is formed to have a thickness of about 10,000 Å.

Figure 4:
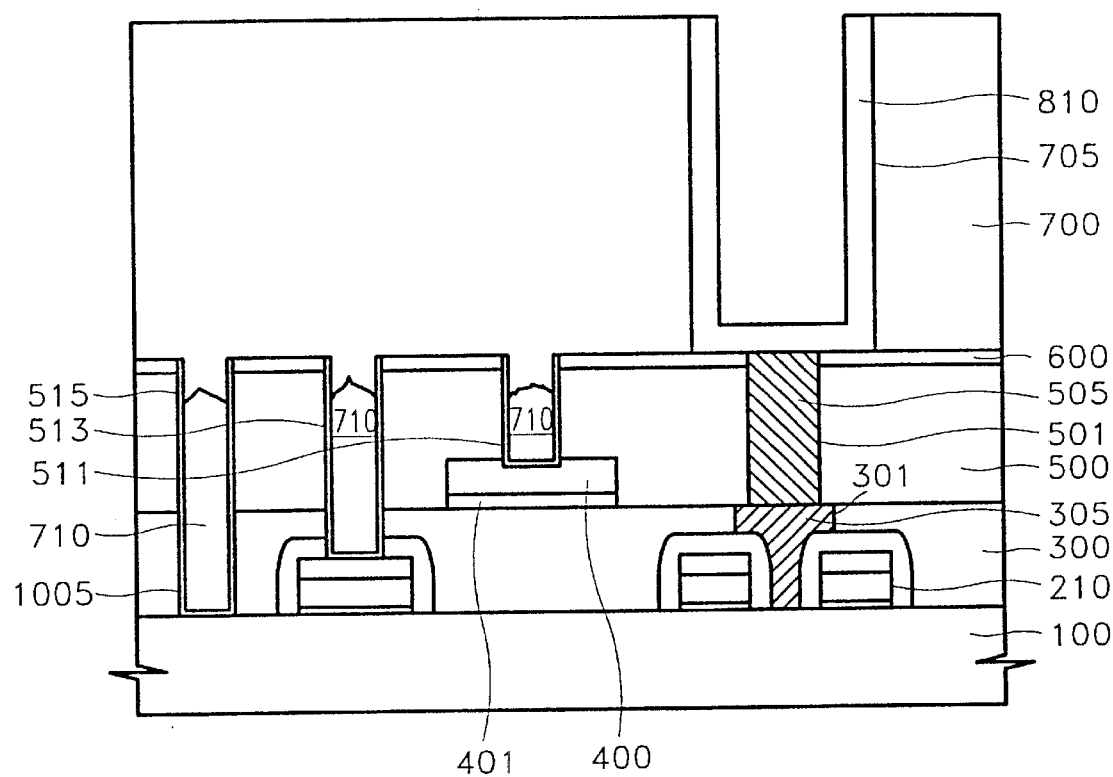

FIG. 4 is a cross-sectional view illustrating a step of forming a lower electrode 810 of a capacitor electrically connected to the buried contacts 305 and 505, which are exposed by the opening 705. Specifically, within the opening 705, a lower electrode layer is formed of a conductive polysilicon layer and is patterned by etch-back or chemical mechanical polishing, thus forming a concave-shaped lower electrode 810. The lower electrode 810 may be formed of any electrode material suitable for use as a capacitor.

Figure 5:
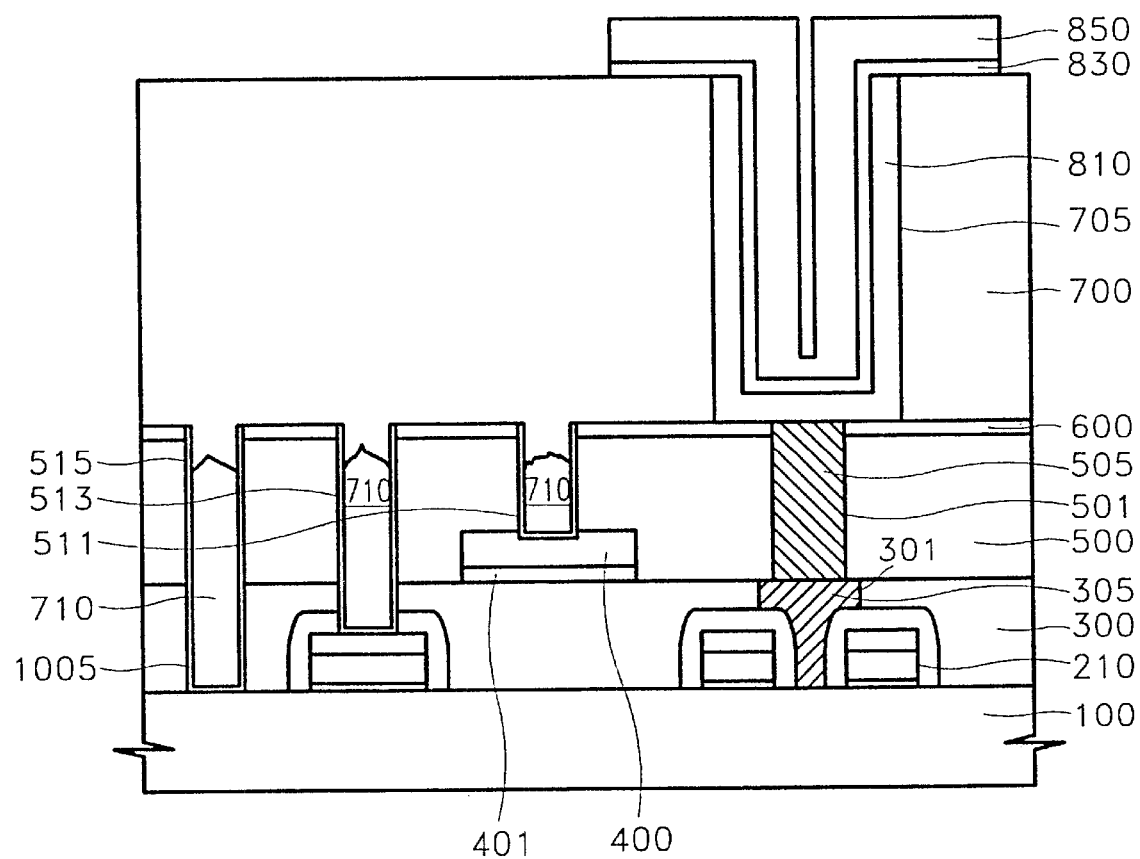

FIG. 5 is a cross-sectional view illustrating a step of forming a dielectric layer 830 and an upper electrode 850. Specifically, the dielectric layer 830 and the upper electrode 850 are sequentially formed on the lower electrode 810, thereby forming a capacitor. The dielectric layer 830 and the upper electrode 850 may be formed of any suitable well-known dielectric materials and electrode materials used for forming the capacitor, respectively.

Figure 6:
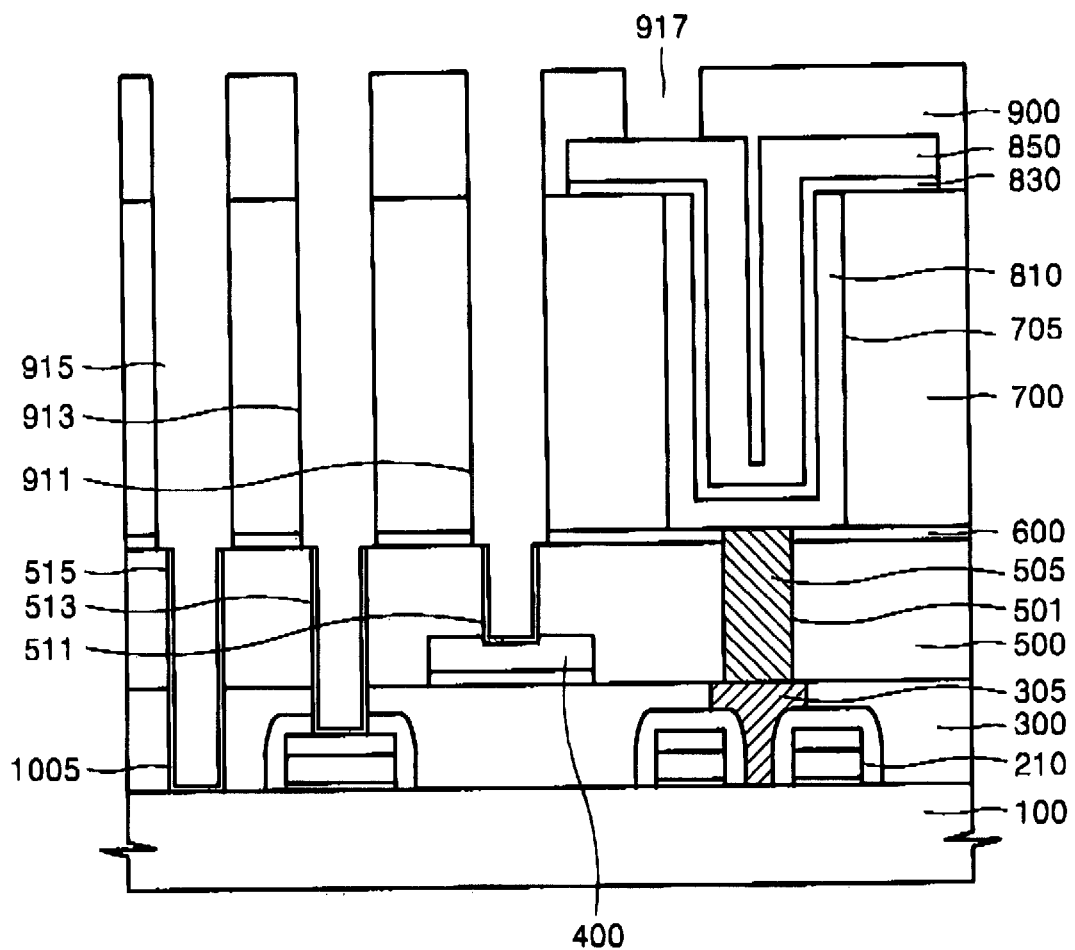

FIG. 6 is a cross-sectional view illustrating a step of forming first, second, and third upper contact hole regions 911, 913, and 915 and a fourth metal contact hole 917 in a fourth dielectric layer 900 on the upper electrode 850. Specifically, after the formation of the upper electrode 850 is completed, the fourth dielectric layer 900 is formed for insulating the capacitor. Next, the first, second, and third upper contact hole regions 911, 913, and 915 are formed to be aligned and connected to the first, second, and third lower contact hole regions 511, 513, and 515, respectively, by patterning the fourth dielectric layer 900 using conventional photolithography and etching processes.

To prevent defects caused by misalignment of the upper contact holes, the first, second, and third upper contact hole regions 911, 913, and 915 are preferably formed to be wider than the first, second, and third lower contact hole regions 511, 513, and 515, respectively. There are actually two advantages to ensuring the first, second, and third lower contact hole regions 511, 513, and 515 are narrower than the first, second, and third upper contact hole regions 911, 913, and 915, respectively. The first is described above, namely, misalignment margins can be sufficiently obtained. Second, the generation of voids 710 in the first, second, and third lower contact hole regions 511, 513, and 515 can be effectively induced when depositing the third dielectric layer 700 since the openings are narrower. The fourth metal contact hole 917 is formed to partially expose the top surface of the upper electrode 850.

Because the voids 710 exist in the first, second, and third lower contact hole regions 511, 513, and 515, the etching process for forming the first, second, and third upper contact hole regions 911, 913, and 915 will continue until the fourth and third dielectric layers 900 and 700 are sufficiently etched and the voids 710 are exposed. As a result, shown in FIG. 6, the semiconductor substrate 100, the conductive pattern of the gate structure 210, and the bit line 400 are substantially exposed.

Thus, as described in the inventive process above, it is not necessary to sequentially etch the first, second, third, and fourth dielectric layers 300, 500, 700, and 900 at once in order to expose the semiconductor substrate 100, the conductive pattern of one of the gate structures 210, and the bit line 400.

While sequential etching of all the dielectric layers is possible, if the first, second, third, and fourth dielectric layers 300, 500, 700, and 900 are sequentially etched at once to expose the semiconductor substrate 100, the conductive pattern of one of the gate structures 210, and the bit line 400, it becomes difficult to prevent damage to the upper surface of the upper electrode 850 caused by the etching process. This is because, even after the fourth metal contact hole 917 formed by the etching process completely exposes the top surface of the upper electrode 850, the etching process needs to continue to expose the semiconductor substrate 100, the conductive pattern of one of the gate structures 210, and the bit line 400. This additional etching time subjects the upper surface of the upper electrode 850 to damage.

However, in the first embodiment of the present invention, the etching process for forming the fourth metal contact hole 917 is substantially carried out while etching just the third and fourth dielectric layers 700 and 900, and therefore it is possible to minimize the degree to which the upper electrode 850 is exposed to the etching process, which minimizes the damage to the surface of the upper electrode.

In addition, in the case of exposing the semiconductor substrate 100, the conductive pattern of one of the gate structures 210, and the bit line 400 by sequentially etching the first, second, third, and fourth dielectric layers 300, 500, 700, and 900 at once, since the active region of the semiconductor substrate 100 is located at a lower position relative to that of the conductive pattern of one of the gate structures 210, and the bit line 400, and since there is a considerable step difference between the active region of the semiconductor substrate 100 and the conductive pattern of one of the gate structures 210, and the bit line 400, the etching process which ultimately forms the fourth metal contact hole 917 is performed to an excessive extent in order to expose the active region of the semiconductor substrate 100. Therefore, it becomes difficult to prevent the active region of the semiconductor substrate 100 from being damaged by the etching process.

However, in the first embodiment of the present invention, since voids 710 exist in the first, second, and third lower contact hole regions 511, 513, and 515, the etching process does not need to be performed to such a degree as to severely damage the active region of the semiconductor substrate 100. In other words, the etching process may be performed only to the extent that the bit line 400 and the conductive pattern of one of the gate structures 210 are exposed. As a result, over-etching can be prevented, and thus damage to the active region of the semiconductor substrate 100 can be prevented.

Figure 7:
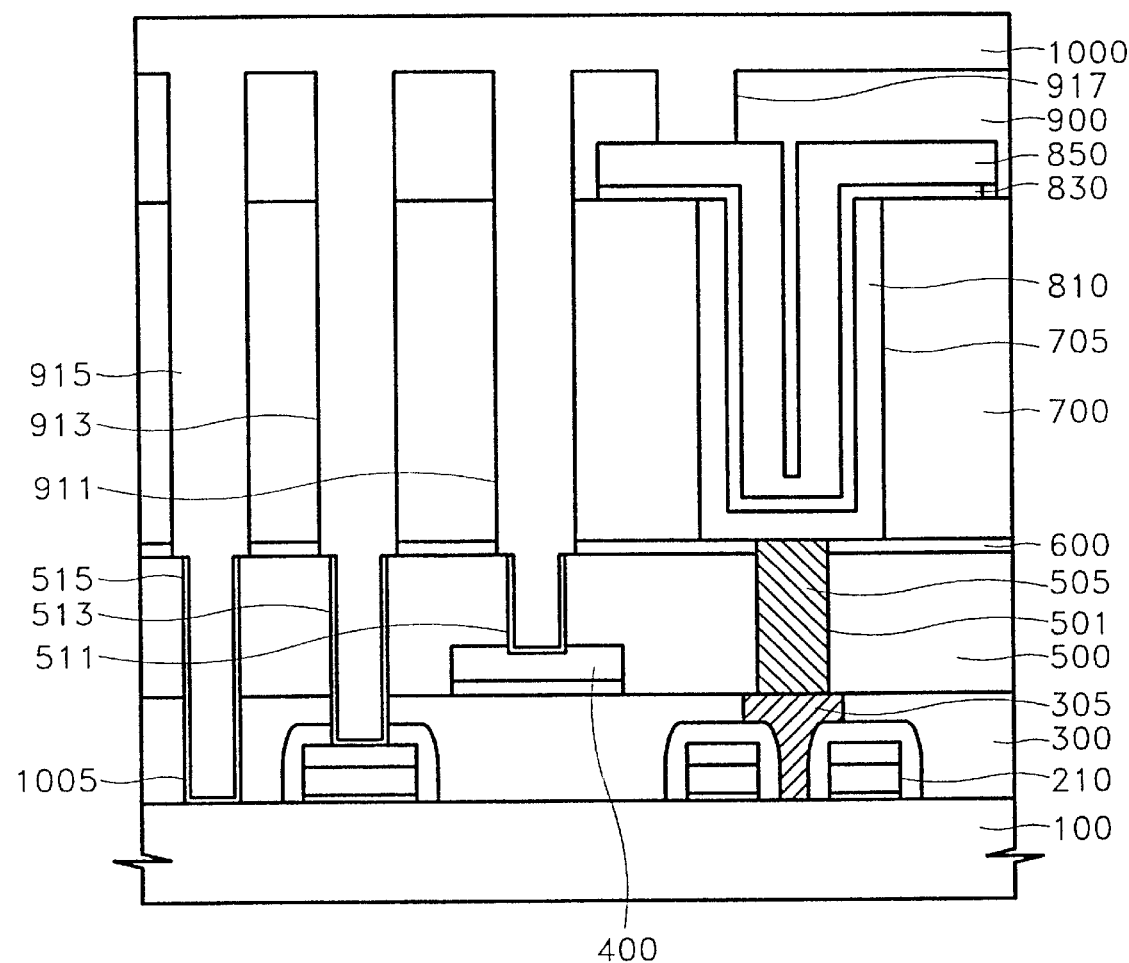

FIG. 7 is a cross-sectional view illustrating a step of forming a metal contact layer 1000. Specifically, the metal contact layer 1000 is formed on the fourth dielectric layer 900 to fill the first, second, and third upper contact hole regions 911, 913, and 915 and the fourth metal contact hole 917. The metal contact layer 1000 also fills the first, second, and third lower contact hole regions 511, 513, and 515 at the same time that it fills the first, second, and third upper contact hole regions 911, 913, and 915 and the fourth metal contact hole 917. As a result, the metal contact layer 1000 is electrically connected to the active region of the semiconductor substrate 100, the conductive pattern of one of the gate structures 210, and the bit line 400, thereby forming a metal contact.

To make the metal contact an ohmic contact, an ohmic layer 1005 may be formed after forming the first, second and third lower contact hole regions 511, 513, and 515 as described previously with regard to FIG. 2. Alternatively, the ohmic layer 1005 may be formed after the formation of the first, second, and third upper contact hole regions 911, 913, and 915 and the fourth metal contact hole 917 is completed. The ohmic layer 1005 may be formed of a Ti/TiN layer. Here, the titanium (Ti) layer may be TiSi$_x$. The ohmic layer 1005 may also be formed of a CoSi layer.

The metal contact layer 1000 may be formed of a conductive material, such as tungsten, copper, or aluminum, and may be formed by a deposition method showing superior step coverage, such as CVD, atomic layered deposition (ALD), or electroplating. For example, in the case of using tungsten to form the metal contact layer 1000, CVD can be used to achieve superior step coverage. In the case of using aluminum to form the metal contact layer 1000, ALD can be used. In the case of using copper to form the metal contact layer 1000, electroplating can be used.

Later, a process of patterning the contact metal layer 1000 may be performed so that the metal contact layer 1000 can act as an interconnection layer.

As described above, in the first embodiment of the present invention, a process of forming a metal plug or a metal stud required in the prior art can be omitted, thereby simplifying the whole manufacturing process. In addition, the first embodiment of the present invention solves a problem where, in the case of simultaneously forming a plurality of contact holes prepared for a variety of metal contacts, an upper electrode or an active region of a semiconductor substrate exposed by the contact holes may be severely damaged by excessively performing a local etching process.

Figure 8:
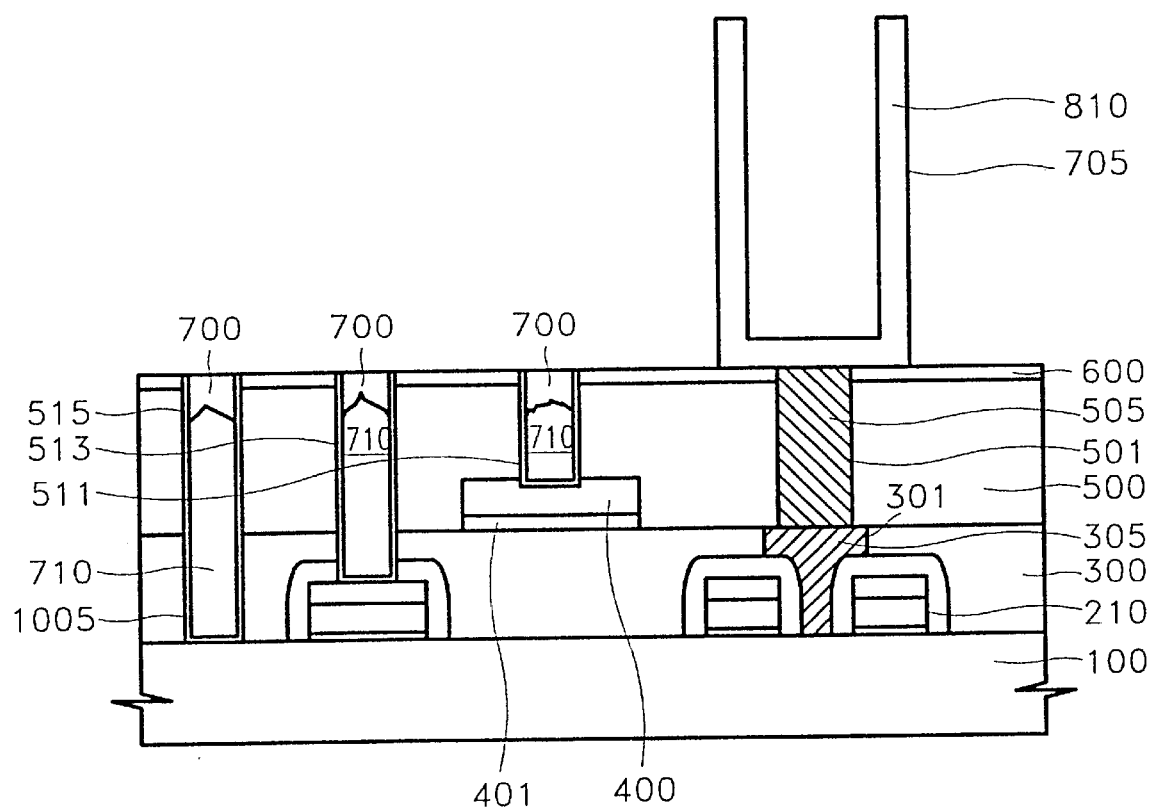
FIGS. 8 through 10 are cross-sectional views illustrating a method for manufacturing a semiconductor device according to a second embodiment of the present invention.
Figure 9:
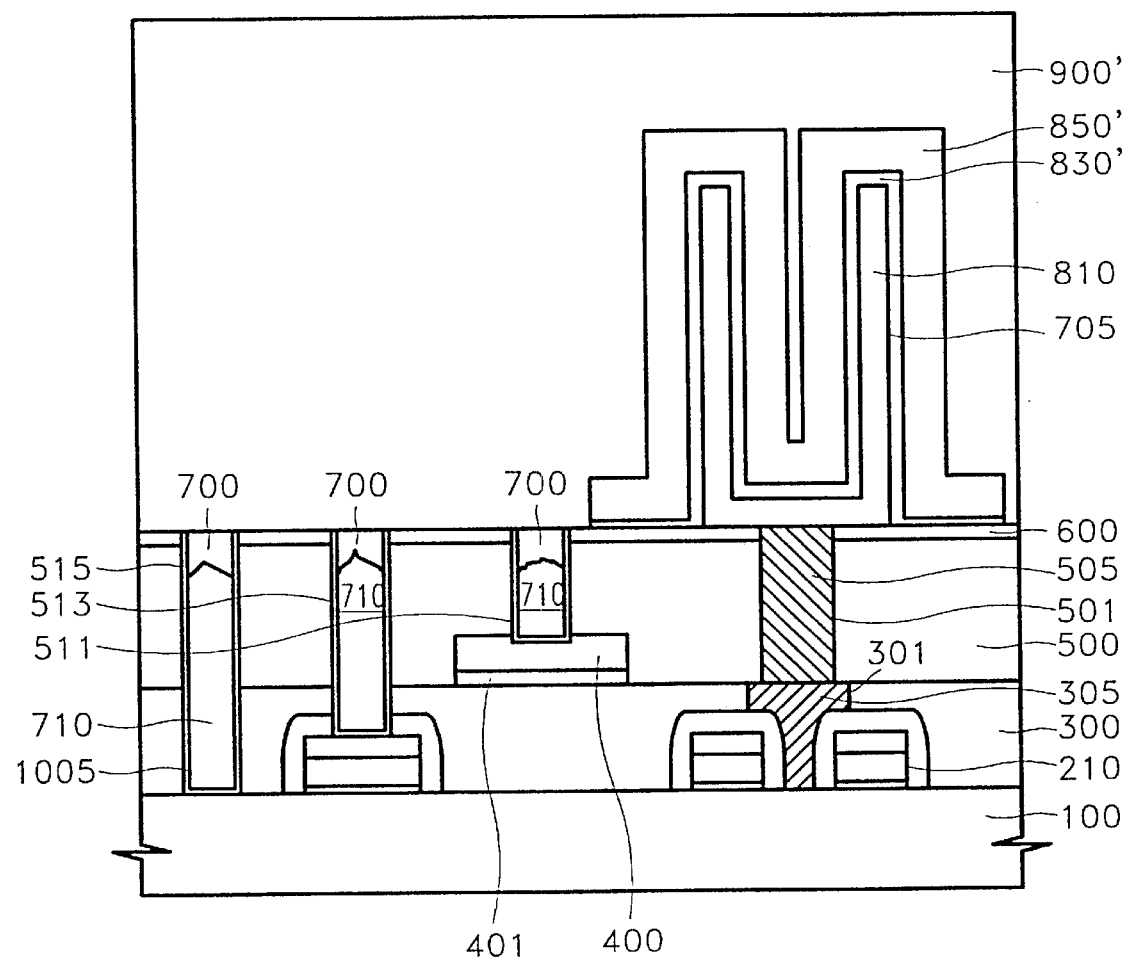
Figure 10:
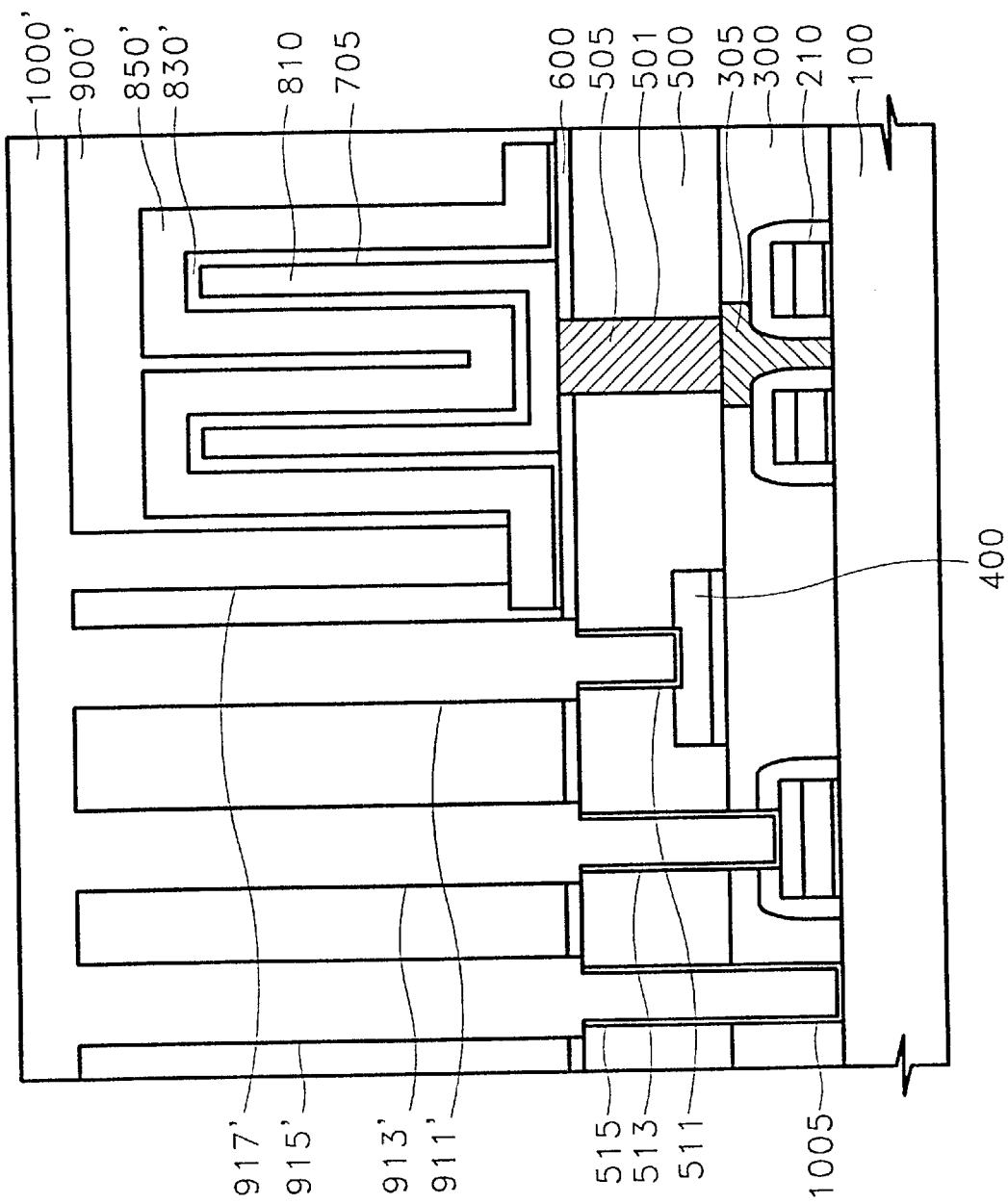
Figure 11:
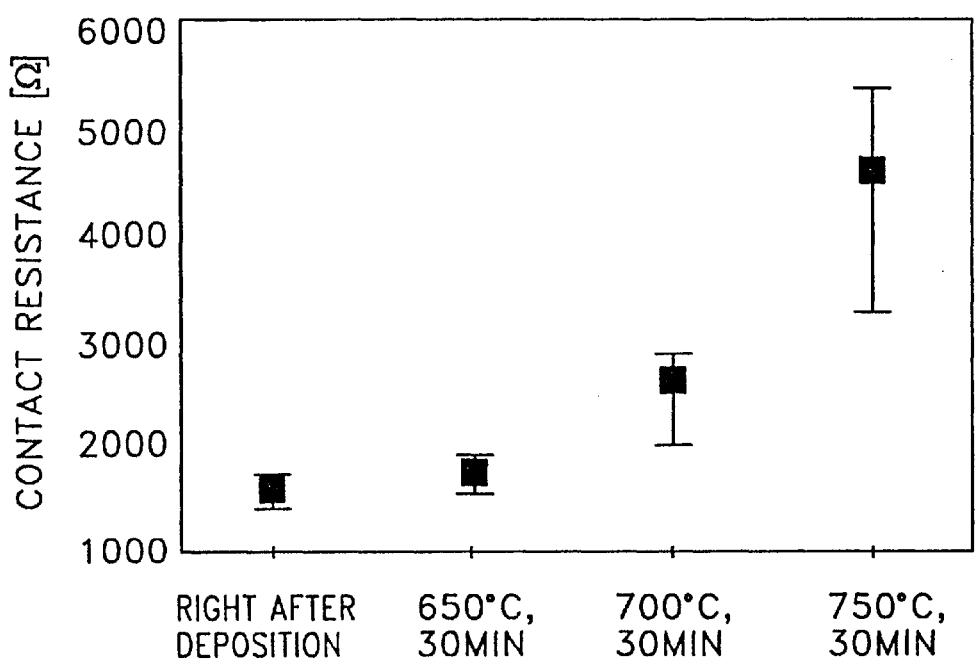
FIG. 11 is a graph showing an increase in the contact resistance of a metal contact caused by heat budgets on the metal contact.

FIGS. 8 through 10 are cross-sectional views illustrating a method for manufacturing a semiconductor device including a metal contact and a capacitor according to a second embodiment of the present invention. The second embodiment of the present invention differs from the first embodiment in the steps of forming a dielectric layer 830' and an upper electrode 850' and the related processes. The first and second embodiments of the present invention are the same in terms of the process steps preceding the step of forming the dielectric layer 830' and the upper electrode 850, and the same reference numerals in the first and second embodiments of the present invention represent the same elements.

Specifically, as described in the first embodiment of the present invention with reference to FIGS. 1 through 4, the third dielectric layer 700 is formed to induce the formation of voids 710, and the lower electrode 810 of a capacitor is formed using the opening 705 of the dielectric layer 700 as a mold.

FIG. 8 is a cross-sectional view illustrating a step of removing the third dielectric layer 700 used as a mold. Specifically, after the lower electrode 810 is formed, the third dielectric layer 700 is selectively removed, by wet etching for example, and is completed when reaching the etching stopper 600. As a result, the third dielectric layer 700 may remain at the entrance portions of the first, second, and third lower contact hole regions 511, 513, and 515, thereby preventing exposure of the voids 710 during the etching process. After the third dielectric layer 700 is selectively removed in this way, the external surface of the lower electrode 810 is exposed as shown in FIG. 8.

FIG. 9 is a cross-sectional view illustrating a step of forming the dielectric layer 830', the upper electrode 850', and a fourth dielectric layer 900'. Specifically, the dielectric layer 830' and the upper electrode 850' are formed on the lower electrode 810 by deposition and patterning processes. In the second embodiment of the present invention (unlike the first embodiment where only the internal surface of the lower electrode 810 is covered with the dielectric layer), the internal and external surfaces of the lower electrode 810 are covered with the dielectric layer 830' to enhance the capacitance of the capacitor being formed. Later, the fourth dielectric layer 900' is formed to cover the upper electrode 850'.

FIG. 10 is a cross-sectional view illustrating steps of forming first, second, and third upper contact hole regions 911', 913' and 915' and a fourth metal contact hole 917' by patterning the fourth dielectric layer 900' and forming a metal contact layer 1000'. Specifically, the fourth dielectric layer 900' is selectively etched by photolithography, thereby forming the first, second, and third contact hole regions 911', 913', and 915' that are aligned and connected to the first, second, and third lower contact hole regions 511, 513, and 515, respectively. At the same time, remaining portions of the third dielectric layer 700 may also be removed. The fourth metal contact hole 917' is formed to expose a portion of the upper electrode 850'.

Next, the metal contact layer 1000' is formed to fill the first, second, and third lower contact hole regions 511, 513, and 515, the first, second, and third upper contact hole regions 911', 913', and 915', and the fourth metal contact hole 917'. The metal contact layer 1000' may be formed of a conductive material, such as tungsten, copper, or aluminum, and may be formed by a deposition method showing superior step coverage, such as CVD, ALD, or electroplating. Next, if necessary, the metal contact layer 1000' is patterned so that it can be used as interconnections.

As described above, it is possible to form metal contact holes by overcoming a high step difference between dielectric layers introduced by the need to form a capacitor and to omit the step of forming a metal plug or a metal stud, thereby simplifying the whole manufacturing process. In addition, it is possible to prevent an etching process for simultaneously forming a variety of metal contact holes from being excessively performed, thereby minimizing the degree to which an exposed upper electrode of a capacitor or an active region of a semiconductor substrate is damaged.

Moreover, since the step of forming a metal contact is performed after the step of forming a capacitor, the metal contact cannot be affected by the heat budget associated with the process for forming a capacitor. Accordingly, it is possible to prevent an increase in the contact resistance of a metal contact caused by the heat budget of subsequent processes.

What is claimed is:

1. A method for manufacturing a semiconductor device, Comprising:

forming gate structures on a semiconductor substrate;

forming a first dielectric layer covering the gate structures;

forming a bit line on the first dielectric layer;

forming a second dielectric layer covering the bit line;

forming a buried contact through the second dielectric layer and the first dielectric layer in the region between adjacent ones of the gate structures, the buried contact being electrically connected to the semiconductor substrate;

forming a third dielectric layer on the second dielectric layer;

forming a lower electrode of a capacitor by patterning the third dielectric layer and forming an opening aligned with and exposing the buried contact, depositing an electrode material within the opening, and patterning the electrode material to form a lower electrode being electrically connected to the buried contact;

forming and patterning, sequentially on the lower electrode, a dielectric layer and an upper electrode layer of the capacitor;

forming a fourth dielectric layer covering the resulting capacitor;

forming a plurality of contact holes through the fourth, third, second and first, dielectric layers to respectively expose the upper electrode layer, the bit line, the conductive pattern of one of the gate structures, and the semiconductor substrate, by selectively etching the fourth dielectric layer and the third, second, and first dielectric layers; and forming a plurality of metal contacts by filling the plurality of contact holes with a conductive material, the metal contacts being electrically connected to the upper electrode layer, the bit line, the conductive pattern of one of the gate structures, and the semiconductor substrate, wherein the forming of the plurality of contact holes comprises forming lower contact hole regions and upper contact hole regions, and before forming the third dielectric layer, the lower contact hole regions are formed by selectively etching the second dielectric layer and first dielectric layer to expose the bit line, the conductive pattern of one of the gate structures, and the semiconductor substrate, and wherein during the forming of the third dielectric layer, the third dielectric layer is formed of a material having discrete step coverage characteristics which cause voids to form within the plurality of lower contact hole regions while depositing the third dielectric layer over the second dielectric layer.

2. The method for manufacturing a semiconductor device of claim 1, wherein the voids created in the lower contact hole regions substantially expose side walls and bottoms of the lower contact hole regions.

3. The method for manufacturing a semiconductor device of claim 1, wherein the third dielectric layer is an oxide layer formed by plasma enhanced chemical vapor deposition.

4. The method for manufacturing a semiconductor device of claim 1, further comprising forming an etching stopper layer after the second the dielectric layer is formed and before the third dielectric layer is formed.

5. The method for manufacturing a semiconductor device of claim 4, wherein the etching stopper is formed of a silicon nitride layer.

6. The method for manufacturing a semiconductor device of claim 1, wherein the forming of the upper contact hole regions comprises selectively etching the fourth dielectric layer and third dielectric layers to form contact holes aligned with and exposing the lower contact hole regions formed though the second dielectric layer and the first dielectric layer.

7. The method for manufacturing a semiconductor device of claim 6, wherein a diameter of the lower contact hole region is less than a diameter of the upper contact hole region.

8. The method for manufacturing a semiconductor device of claim 1, further comprising forming an ohmic layer in the plurality of contact holes before forming the plurality of metal contacts.

9. The method for manufacturing a semiconductor device of 1, further comprising forming an ohmic layer in the plurality of lower contact hole regions before forming the third dielectric layer.

10. The method for manufacturing a semiconductor device of claim 1, further comprising forming an ohmic layer in the lower contact hole regions and the upper contact hole regions before forming the plurality of metal contacts.

11. A method for manufacturing a semiconductor device, comprising:

forming gate structures on a semiconductor substrate;

forming a first dielectric layer covering the gate structures;

forming a bit line on the first dielectric layer;

forming a second dielectric layer covering the bit line;

forming a buried contact through the second dielectric layer and the first dielectric layer in the region between adjacent ones of the gate structures, the buried contact being electrically connected to the semiconductor substrate;

forming a third dielectric layer on the second dielectric layer;

forming a lower electrode of a capacitor by patterning the third dielectric layer and forming an opening aligned with and exposing the buried contact, depositing an electrode material within the opening, and patterning the electrode material to form a lower electrode being electrically connected to the buried contact;

forming and patterning, sequentially on the lower electrode, a dielectric layer and an upper electrode layer of the capacitor;

forming a fourth dielectric layer covering the resulting capacitor;

forming a plurality of contact holes through the fourth, third, second and first, dielectric layers to respectively expose the upper electrode layer, the bit line, the conductive pattern of one of the gate structures, and the semiconductor substrate, by selectively etching the fourth dielectric layer and the third, second, and first dielectric layers; and forming a plurality of metal contacts by filling the plurality or contact holes with a conductive material, the metal contacts being electrically connected to the upper electrode layer, the bit line, the conductive pattern of one of the gate structures, and the semiconductor substrate, wherein the forming of the plurality of contact holes comprises forming lower contact hole regions and upper contact hole regions, and before forming the third dielectric layer, the lower contact hole regions are formed by selectively etching the second dielectric layer and first dielectric layer to expose the bit line, the conductive pattern of one of the gate structures, and the semiconductor substrate, and wherein during the forming of the third dielectric layer, the third dielectric layer is deposited along openings of each of the plurality of lower contact hole regions to thereby seal the opening each of he plurality of lower contact hole regions and precluding additional material of the third dielectric layer from forming in the lower contact hole regions, to form voids in the lower contact hole regions.

12. The method for manufacturing a semiconductor device of claim 11, wherein the voids created in the lower contact hole regions substantially expose side walls and bottoms of the lower contact hole regions.

13. The method for manufacturing a semiconductor device of claim 11, further comprising, prior to forming the lower electrode, forming an interlayer dielectric layer over the third dielectric layer, after the third dielectric layer has sealed the opening each of the plurality of lower contact hole regions, wherein the interlayer dielectric layer has greater fluidity relative to the third dieelectric layer.

14. A method for manufacturing a semiconductor device, comprising:

forming gate structures on a semiconductor substrate;

forming a first dielectric layer covering the gate structures;

forming a bit line on the first dielectric layer;

forming a second dielectric layer covering the bit line;

forming a buried contact through the second dielectric layer and the first dielectric layer in the region between adjacent ones of the gate structures, the buried contact being electrically connected to the semiconductor substrate;

forming a plurality of lower contact hole regions by selectively etching the second dielectric layer and first dielectric layer to expose the bit line, the conductive pattern of one of the gates structures, and the semiconductor substrate;

forming a third dielectric layer on the second dielectric layer;

forming a lower electrode of a capacitor by (a) patterning the third dielectric layer and forming an opening aligned with and exposing the buried contact, (b) depositing an electrode material within the opening, and (c) patterning the electrode material to form a lower electrode being electrically connected to the buried contact;

forming and patterning, sequentially on the lower electrode, a dielectric layer and an upper electrode layer of the capacitor;

forming a fourth dielectric layer covering the resulting capacitor;

forming upper contact hole regions by selectively etching the fourth dielectric layer and third dielectric layer to form contact holes aligned with and exposing the lower contact hole regions;

forming a metal contact hole exposing the upper electrode by selectively etching the fourth dielectric layer in the region of the upper electrode of the capacitor; and forming a plurality of metal contacts which are electrically connected to the upper electrode, the bit line, the conductive pattern of one of the gate structures, and the semiconductor substrate, by filling the metal contact hole, the plurality of upper contact hole regions, and the plurality of lower contact hole regions, wherein during the forming of the third dielectric layer, the third dielectric layer is deposited along openings of each of the plurality of lower contact hole regions to thereby seal the opening each of the plurality of lower contact hole regions and precluding additional material of the third dielectric layer from forming in the lower contact hole regions, to form voids in the lower contact hole regions.

15. The method for manufacturing a semiconductor device of claim 14, wherein the voids created in the lower contact hole regions substantially expose side walls and bottoms of the lower contact hole regions.

16. The method for manufacturing a semiconductor device of claim 14, further comprising forming an etching stopper layer after the second dielectric layer is formed and before the third dielectric layer is formed.

17. The method for manufacturing a semiconductor device of claim 16, wherein the etching stopper is formed of a silicon nitride layer.

18. The method for manufacturing a semiconductor device of claim 14, wherein a diameter of the lower contact hole region is less than a diameter of the upper contact hole region.

19. The method for manufacturing a semiconductor device of claim 14, further comprising forming an ohmic layer in the plurality of lower contact hole regions and upper contact hole regions before forming the plurality of metal contacts.

20. The method for manufacturing a semiconductor device of claim 14, further comprising forming an ohmic layer in the plurality of lower contact hole regions before forming the third dielectric layer.

21. A method for manufacturing a semiconductor device, comprising:

forming gate structures on a semiconductor substrate;

forming a first dielectric layer covering the gate structures;

forming a bit line on the first dielectric layer;

forming a second dielectric layer covering the bit line;

forming a buried contact through the second dielectric layer and the first dielectric layer in the region between adjacent ones of the gate structures, the buried contact being electrically connected to the semiconductor substrate;

forming a plurality of lower contact hole regions by selectively etching the second dielectric layer and first dielectric layer to expose the bit line, the conductive pattern of one of the gate structures, and the semiconductor substrate;

forming a third dielectric layer on the second dielectric layer;

forming a lower electrode of a capacitor by (a) patterning the third dielectric layer and forming an opening aligned with and exposing the buried contact, (b) depositing an electrode material within the opening, and (c) patterning the electrode material to form a lower electrode being electrically connected to the buried contact;

forming and patterning, sequentially on the lower electrode, a dielectric layer and an upper electrode layer of the capacitor;

forming a fourth dielectric layer covering the resulting capacitor;

forming upper contact hole regions by selectively etching the fourth dielectric layer and third dielectric layer to form contact holes aligned with and exposing the lower contact hole regions;

forming a metal contact hole exposing the upper electrode by selectively etching the fourth dielectric layer in the region of the upper electrode of the capacitor; and forming a plurality of metal contacts which are electrically connected to the upper electrode, the bit line, the conductive pattern of one of the gate structures, and the semiconductor substrate, by filing the metal contact hole, the plurality of upper contact hole regions, and the plurality of lower contact hole regions, wherein during the forming of the third dielectric layer, the third dielectric layer is formed of a material having discrete step coverage characteristics which cause voids to form within the plurality of lower contact hole regions while depositing the third dielectric layer over the second dielectric layer, and wherein the third dielectric layer is formed by plasma enhanced chemical vapor deposition.

* * * * *